United States Patent [19]
Bok

[11] Patent Number: 5,339,842
[45] Date of Patent: Aug. 23, 1994

[54] METHODS AND APPARATUS FOR CLEANING OBJECTS

[75] Inventor: Hendrik F. Bok, Fairhaven, Mass.

[73] Assignee: Specialty Coating Systems, Inc., Indianapolis, Ind.

[21] Appl. No.: 993,098

[22] Filed: Dec. 18, 1992

[51] Int. Cl.$^5$ ............................................. B08B 3/10
[52] U.S. Cl. ............................... 134/1; 134/25.4; 134/184; 134/186; 134/155
[58] Field of Search ............ 134/155, 184, 186, 702, 134/1, 25.4

[56] References Cited

U.S. PATENT DOCUMENTS

| | | | |
|---|---|---|---|
| 1,289,507 | 12/1918 | Mason . | |
| 3,102,666 | 9/1963 | Fresard | 134/200 X |
| 3,294,576 | 12/1966 | Geraghty | 117/98 |
| 3,367,791 | 2/1968 | Lein | 117/37 |
| 3,429,741 | 2/1969 | Moriarty | 117/111 |
| 3,473,955 | 10/1969 | Moriarty | 117/111 |
| 3,535,157 | 10/1970 | Steinhoff et al. | 117/212 |
| 3,589,975 | 6/1971 | Andrews et al. | 161/165 |
| 3,668,905 | 6/1972 | Schilnke | 134/1 |
| 3,756,196 | 9/1973 | Furuuchi et al. | 118/401 |
| 4,004,045 | 1/1977 | Stelter | 427/55 |
| 4,114,563 | 9/1978 | Schnedler et al. | 118/63 |
| 4,154,193 | 5/1979 | Moriguchi et al. | 118/230 |
| 4,370,356 | 1/1983 | Bok et al. | 427/38 |
| 4,570,453 | 2/1986 | Kamio et al. | 134/122 R |
| 4,676,404 | 6/1987 | Yamazaki et al. | 222/56 |
| 5,014,727 | 5/1991 | Aigo | 134/184 |
| 5,090,432 | 2/1992 | Bran | 134/184 |
| 5,145,546 | 9/1992 | Yuasa et al. | 156/324 |

FOREIGN PATENT DOCUMENTS

| | | | |
|---|---|---|---|
| 1071906 | 12/1959 | Fed. Rep. of Germany . | |
| 3-77319 | 4/1991 | Japan | 134/184 |
| 3-109733 | 5/1991 | Japan | 134/902 |
| 3-124027 | 5/1991 | Japan | 134/902 |
| 3-191523 | 8/1991 | Japan | 134/902 |
| 3-237717 | 10/1991 | Japan | 134/902 |
| 3-257026 | 11/1991 | Japan | 134/902 |
| 4-561132 | 2/1992 | Japan | 134/902 |
| 4-139823 | 5/1992 | Japan | 134/902 |
| 4-253332 | 9/1992 | Japan | 134/902 |
| 4-290432 | 10/1992 | Japan | 134/902 |

*Primary Examiner*—Frankie L. Stinson
*Attorney, Agent, or Firm*—W. K. Volles

[57] ABSTRACT

Cleaning methods and apparatus for removing particulate materials from the surfaces of objects are disclosed. Megasonic vibrations are utilized to cause a liquid cleaning fluid in a first reservoir to rise above the upper end of the first reservoir, contact the surface of the object to be cleaned and flow over a weir at the upper end of the first reservoir into a second reservoir. The methods and apparatus are useful to remove small particles, e.g. having a particle size of less than about 1 micron, from flat or curved planar surfaces. The methods and apparatus can be integrated with subsequent processing steps, e.g. applying thin film coatings, without intermediate handling of the objects.

20 Claims, 2 Drawing Sheets

METHODS AND APPARATUS FOR CLEANING OBJECTS

FIELD OF THE INVENTION

The present invention relates to cleaning objects. More specifically, the present invention relates to methods and apparatus for cleaning objects which have curved or flat planar surfaces using megasonic vibrations.

BACKGROUND OF THE INVENTION

The application of thin coatings, e.g., less than about 10 microns, has become an increasingly important step in the manufacturing of various products such as, for example: flat panel displays such as used in lap top computers, high definition television and computer cathode ray tubes; optical devices such as lenses, color filters and mirrors; hybrid circuit boards, silicon wafers and germanium wafers.

As the thickness of such coatings decreases, e.g., to about 1 micron or less, it is necessary for the surfaces of the objects being coated to be extremely clean in order to insure minimal defects in the coatings. For example, some active display panels have as many as 10 to 15 layers of coatings, each having thicknesses of from about 500 angströms to 5 microns. Some wafers have conductive line spacings on the order of about 0.5 micron. Accordingly, particles even as small as about 1 micron or less can interfere and cause defects in these extremely thin coatings.

Ultrasonic transducers are often used to introduce vibrations into cleaning solutions to enhance the removal of particles from the surfaces of objects. Ultrasonic transducers vibrate at frequencies of from about 10 to 40 kilohertz ("KHz"). While ultrasonic cleaning is effective to move relatively large particles, it is virtually ineffective in removing particles having a particle size of about 1 micron or less.

Megasonic cleaning is a method similar to ultrasonic cleaning, but uses vibration frequencies of approximately 800 KHz to 1.8 megahertz ("MHz"). Megasonic cleaning can be highly effective for removing particles having a particle size of about 1 micron or less.

Ultrasonic and megasonic cleaning methods usually involve immersing the objects in a bath of liquid cleaning fluid and introducing the ultrasonic or megasonic vibrations through the cleaning fluid to dislodge particles attached to the surface of the objects. Such cleaning methods usually operate in a batch mode, thereby requiring subsequent handling of the objects, either by robots or humans, after cleaning and prior to the next process step, e.g., coating. Accordingly, small particles can readily attach to the surfaces during such handling.

One particularly useful method for applying thin coatings to objects is described in U.S. Pat. No. 4,370,376, issued Jan. 25th, 1983. At Column 1, lines 40 to 57, the patentees disclose that:

"According to the present invention, meniscus coating of an object such as a substrate is accomplished by flowing a coating material through a permeable and sloping surface, so as to develop a downward laminar flow of coating material on the outside of the sloping surface. The object, having a surface to be coated, is advanced tangentially to the downward laminar flow of coating material, such that the surface to be coated intersects the laminar flow of coating material at the apex of the sloping, permeable surface menisci of flowing coating material are supported both at the leading edge and the trailing edge of coating material in contact with the surface to be coated. The uniform disengagement and drainage of deposited excess coating material from the coated surface are ensured by uniform menisci and the constant downward laminar flow of coating material on the outside of the sloping surface."

The patentees further disclose that surface of the object may be cleaned prior to coating. At Column 6, lines 38 to 46, the patentees disclose that:

"The cleaning processes may include solvent washing with brushes, ultrasonic scrubbing and/or other mechanical scrubbing methods. The substrate may then be rinsed with high purity water and/or solvent prior to solvent drying and removal. A porous cylindrical applicator may be utilized, also, to clean and rinse the substrate with solvents. Solvent drying may include evaporative operations via controlled gas flow and/or vacuum processes."

However, although such cleaning methods are typically effective to remove relatively large particles, e.g., greater than about 1 micron, they are often ineffective to remove particles having particle sizes of less than about 1 micron.

Accordingly, methods and apparatus are desired for cleaning the surfaces of objects to remove small particles, e.g., less than about 1 micron. In addition, methods and apparatus for cleaning such objects are desired which can be utilized immediately prior to subsequent processing steps which are sensitive to the presence of the particles.

SUMMARY OF THE INVENTION

In accordance with the present invention, methods and apparatus are provided for cleaning the surfaces of objects to remove small particles, e.g., less than about 1 micron. By virtue of the present invention it is now possible to clean the surfaces without requiring intermediate handling of the objects prior to subsequent processing steps, e.g., coating, which may be sensitive to the presence of the particles.

In one aspect of the present invention, a method is provided for cleaning an object. The method includes the steps of:

a) introducing megasonic vibrations into a volume of a liquid cleaning fluid having an upper liquid level, said fluid being contained in a first reservoir having a weir, said vibrations being effective to cause the upper level of said fluid to rise above the weir at a distance of at least 0.5 millimeter and cause said fluid to flow over the weir into a second reservoir; and b) contacting the upper level of the fluid above the weir with a surface of the object to be cleaned, the surface of the object being disposed above the weir such that at least a portion of the fluid contacts the surface of the object prior to flowing over the weir into the second reservoir.

In another aspect of the present invention, an apparatus is provided for cleaning an object. The apparatus includes:

a) a first reservoir having a top end which is at least partially open, a bottom end which is at least partially closed, at least one side wall and a weir disposed at the top end;

b) a second reservoir having a top end which is at least partially open, a bottom end which is at least partially closed and at least one side wall, said second reservoir being positioned such that the top end of the second reservoir is below the top end of the first reservoir and alligned to receive a liquid cleaning fluid flowing from the first reservoir over the weir; and c) a transducer disposed at the bottom end of the first reservoir, said transducer being capable of generating megasonic vibrations in a generally perpendicular direction from the bottom end toward the top end of the first reservoir.

DETAILED DESCRIPTION OF THE INVENTION

The particular objects being cleaned are not critical to the present invention. Typically, cleaning may be required, for example, as a pretreatment step in coating operations or for enhancing the adhesion properties of a surface or for promoting the surface wetting characteristics of an object. The methods and apparatus of the present invention are particularly suited for cleaning objects which have flat or curved planar surfaces. Examples of such objects include, but are not limited to: flat panel displays such as used in lap top computers, high definition television and computer cathode ray tubes; optical devices such as lenses, color filters and mirrors; hybrid circuit boards, silicon and germanium wafers (also referred to in the art as semiconductors) and memory disks, etc. In addition, the surfaces of the objects can either be smooth, e.g., a glass panel, or irregular, e.g., silicon wafers or gemanium wafers which have a stepped topography. Typical materials of construction of the objects include, for example, glass, ceramics, metals, plastics and combinations thereof.

The particles, also referred to herein as "particulate materials", generally have a particle size of about 10 microns or less. Preferably, the particle size is about 1 micron or less and most preferably from about 0.1 to 1 micron. Such particulate materials are often present in the atmosphere where manufacturing operations are conducted, even in clean-room environments. The sources of such particulate materials include, for example, dust, microorganisms and organic vapors.

The particular liquid cleaning fluids are not critical to present invention. Typical cleaning fluids include, for example, solvents and detergents. However, solvents are generally preferred since they are generally more volatile than aqueous detergents and accordingly the time required for evaporation of the solvents is less. Lower alcohols, e.g., those having from 1 to 4 carbon atoms, are a preferred class of solvents. Ethanol and isopropyl alcohol are especially preferred cleaning fluids for use in accordance with the present invention.

The invention is further described with reference to the drawings which are presented for illustrative purposes and are not intended to limit the scope of the claims which follow. Those skilled in the art will recognize that the drawings are presented in a simplified form and do not illustrate various details which are known to those skilled in the art such as, for example, valves, switches, process control devices, wiring, heating elements and the like.

Figure 1:
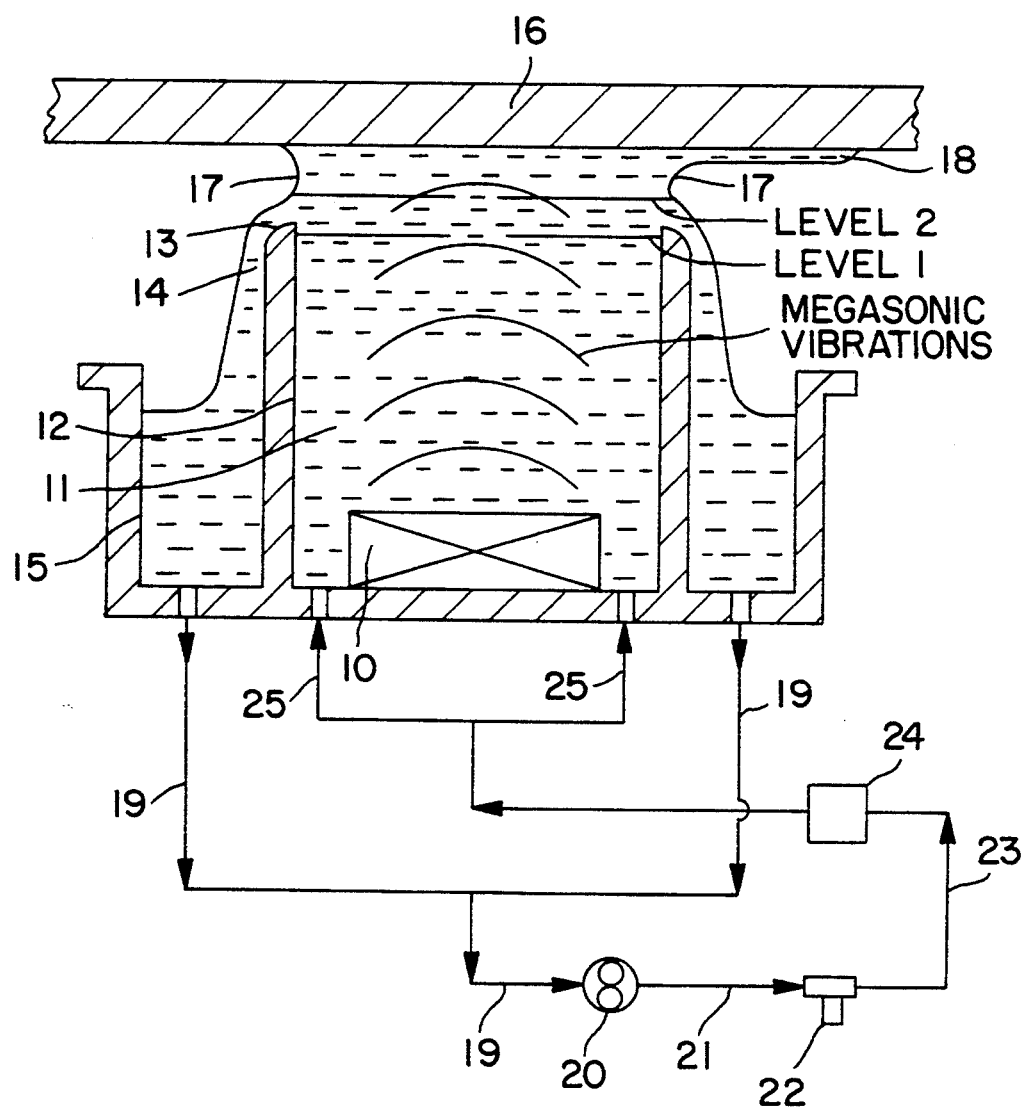
FIG. 1, is a schematic illustrating a cleaning method in accordance with the present invention.

FIG. 1 is a schematic illustrating a method for cleaning in accordance with the present invention. A transducer 10 is used to introduce megasonic vibrations, preferably having a vibration frequency of from about 800 KHz to 1.8 MHz, into a volume of liquid cleaning fluid 11 which is contained is a first reservoir 12. Prior to introducing the megasonic vibrations, the fluid has an upper liquid level within the first reservoir at a LEVEL 1.

Upon energizing transducer 10, megasonic vibrations travel upward through the fluid and raise the upper liquid level to a LEVEL 2 which is above a weir 13. Typically the distance between the upward liquid level, i.e., LEVEL 2, and the weir will be at least about 0.5 millimeters, preferably from about 1 to 10 millimeters and most preferably from about 2 to 5 millimeters. Preferably, the source of the megasonic vibrations is from a lower portion of the first reservoir and the waves travel through the fluid in a generally perpendicular direction from the bottom end of the first reservoir toward the top end. The level of energy input required to achieve movement of the fluid depends on the volume of fluid in the first reservoir and can be determined by those skilled in the art. For example, for fluid volumes on the order of about 2 liters, typical energy input levels will range from about 20 to 100 watts.

When the liquid level rises above weir 13, a portion of the fluid 14 flows over the weir and into a second reservoir 15 which collects the overflow. The upper liquid level of the fluid, i.e., fluid above the weir, is then contacted with a surface of the object to be cleaned 16 which is generally disposed above the weir such that at least a portion of the fluid contacts the surface prior to flowing over weir 13 into second reservoir 15. The orientation of object 16 is preferably inverted relative to the upper liquid level of the cleaning fluid. The contacting can be accomplished, for example, either by raising first reservoir 12 to a level where the upper level of the fluid contacts the object, or, alternatively, by lowering the surface of the object until it contacts the upper level of the fluid. Preferably, the contacting is accomplished by raising the first reservoir to a level such that weir 13 almost contacts the surface of object 16 and is sufficient to form menisci 17 which comprises a liquid column disposed between the surface of object 16 and the upper end of first reservoir 12, e.g., from about 1 to 5 millimeters. Then, first reservoir 12 is lowered to a distance such that menisci 17 are maintained yet there is a substantially free flow of fluid 14 over weir 13. Typically, the distance between the upper end of the first reservoir, i.e., weir 13, and the surface of object 16 will be greater than about 1 millimeter and preferably from about 2 to 10 millimeters after first reservoir 12 has been lowered.

The cleaning can be conducted in a stationary position, or, alternatively, object 16 can be advanced relative to first reservoir 12. Either object 16 or first reservoir 12 or both can be physically moved to effect the advancement. It is preferred to advance object 16 relative to first reservoir 12 in a generally horizontal direction. However, the orientation of object 16 can be inclined if desired. Typical rates of advancement are from about 10 to 1,000 millimeters per minute and more typically from about 25 to 250 millimeters per minute. Object 16 is advanced in the direction of the arrow to provide a film of solvent 18 which preferably evaporates at or faster than the rate of advancement of object 16. Heating and/or purging with an inert gas, e.g., nitrogen, can be used to increase the evaporation rate of the solvent if desired. Such techniques are known to those skilled in the art.

Fluid is withdrawn from second reservoir 15 via line 19 and passed to a pump 20 in order to recirculate the fluid back to first reservoir 12. Preferably, such recirculation causes fluid 11 in first reservoir 12 to flow over weir 13 into second reservoir 15. This is believed to enhance the cleaning action of the megasonic vibrations. Accordingly, preferably the flow rate through pump 20 is sufficient to create fluid flow over weir 13. Circulation rates generally range from about 1 volume of fluid per 100 minutes to about 1 volume of fluid per minute. The volume of cleaning fluid is not critical to the present invention but typically ranges from about 10 milliliters to about 10 liters. The recirculation step is preferably conducted continuously during the steps of introducing the megasonic vibrations and contacting the fluid with surface of object 16. The pressusre of fluid in line 21 is typically from about 2 to 6 psig depending on the pore size of the filter and viscosity of the cleaning fluid.

The fluid withdrawn from second reservoir 15 often contains particulate materials. Accordingly, it is preferred to pass the fluid withdrawn from pump 20 via line 21 to a filter 22. Preferably, the filtration step is effective to remove at least about 90 percent, and more preferably at least about 99 percent, of the particulate materials in line 21 having a particle size greater than about 0.1 micron. A pressurized, filtered fluid is withdrawn from filter 22 via line 23, passed through a heating and cooling element 24 and introduced into first reservoir 12 via line 25.

The cleaning method of the present invention can be effective to remove particles having particles sizes of less than about 1 micron from the surfaces of objects. Preferably, after cleaning, less than about 90 percent, and more preferably less than about 99 percent, of the particles on the surface of the object have a particle size of greater than about 0.1 micron. Methods for measuring the amount and size of particles remaining on the surface after cleaning are known to those skilled in the art.

The temperature at which the cleaning is conducted is not critical to the present invention although it is generally desirable to operate the method at a temperature below the boiling point of the cleaning fluid. Typical operating temperatures are in the range of about 60° to 150° F. Preferably, the cleaning is conducted at about ambient temperature, i.e., room temperature, to about 15° F. above ambient temperature in order to avoid condensation of water from the surrounding atmosphere onto the surface of the object. One advantage of the present invention is that the megasonic vibrations are often effective to increase the temperature of the surface of the object by up to about 15° F. This temperature increase has been found to enhance the evaporation rate of the cleaning fluid remaining on the surface after cleaning. The above-mentioned heating and cooling element 24 is useful for controlling the temperature of the cleaning fluid at the desired temperature.

The operating pressure at which the cleaning is conducted is also not critical to the present invention. Typically, the process will operate at about atmospheric pressure, although superatmospheric pressures and vacuum pressures can be employed. For example, it may be desirable to perform the cleaning step at slightly positive pressure, e.g., 2 to 5 psig in an inert atmosphere with a purge gas, e.g., nitrogen, helium or argon. Similarly, it may be desirable to perform the cleaning step under slight vacuum conditions, e.g., less than about 1 psig, in order to divert the flow of evaporating solvent to a desired location.

The methods of the present invention are useful for cleaning the surface of an object prior to a subsequent processing step, such as, for example, coating, adhesion promotion or enhancing wetability. The methods are particularly useful when integrated with a process in order to perform the cleaning step immediately prior to the subsequent processing step. For example, the coating method described in above-referenced U.S. Pat. No. 4,370,356 can be readily adapted to accomodate the cleaning methods of the present invention because the coating step is performed on a object which is inverted. Thus, the methods of the present invention can be conducted, in line, immediately prior to the coating step. Even in other processees where the coating step is performed on an upright surface, e.g., spin coating, spray coating and roller coating, the methods of the present invention can be readily integrated by utilizing a rotating chuck for holding the object. Details concerning such rotating chucks are known by those skilled in the art.

Figure 2:
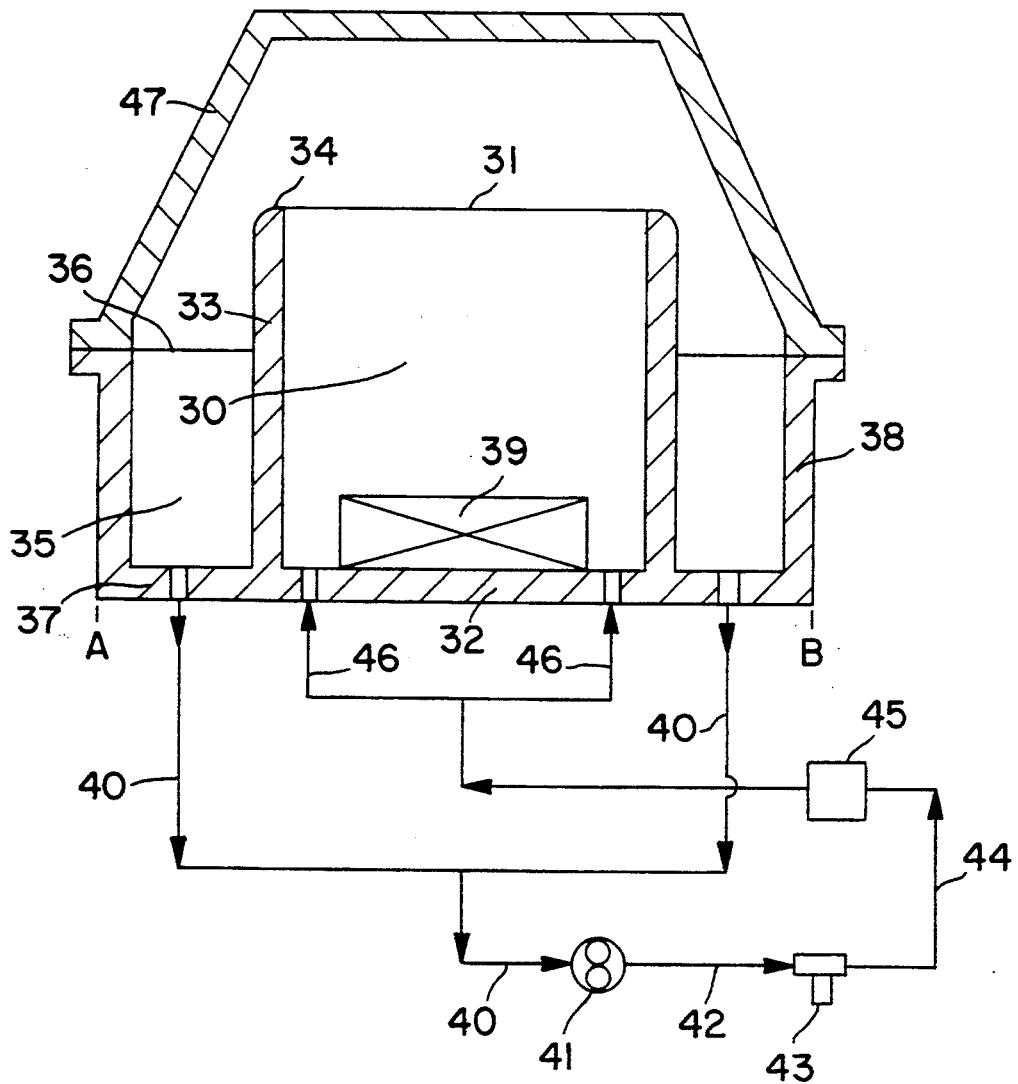
FIG. 2, is a schematic illustrating a cleaning apparatus in accordance with the present invention.

FIG. 2 is a schematic illustrating an apparatus in accordance with the present invention. The apparatus comprises a first reservoir 30 having a top end 31 which is at least partially open, a bottom end 32 which is at least partially closed, at least one side wall 33 and a weir 34 disposed at the top end. Preferably top end 31 is completely open. Preferably bottom end 32 is closed except for passages to allow fluid transport via line 46, the source of which is hereafter described. Alternatively, bottom end 32 can be completely closed and the opening for line 46 can be in the side wall. The number of side walls 33 depends upon the cross-sectional geometry of the first reservoir. From a top view prospective, the first reservoir may have, for example, a circular, square, rectangular, triangular or eliptical cross-section, although other cross-sectional geometries are within the scope of the invention. Preferably, there is either 1 side wall, e.g., circular cross-section, or 4 side walls e.g., rectangular cross-section. Preferably, the top end of the side wall or side walls forms the weir. Thus, when first reservoir 30 has a rectangular cross-section, for example, the upper end of each side wall forms the weir. When first reservoir 30 has a circular cross-section, for example, there is one continuous side wall which forms the weir at its upper end. Alternatively, the weir can also be present as a separate element attached to a side wall, for example.

The apparatus also comprises a second reservoir 35 having a top end 36 which is at least partially open, a bottom end 37 which is at least partially closed and at least one side wall. Preferably top end 36 is completely opened. Preferably bottom end 37 is closed except for passages to allow fluid transport out via line 40, the source which is hereafter described. Alternatively, bottom end 37 can be completely closed and the opening for line 40 can be in the side wall. The number of side walls 38 depends, in a similar fashion to first reservoir 30, on its cross-sectional geometry. Preferably second reservoir 35 has the same cross sectional geometry as first reservoir 30, with first reservoir 30 being disposed generally concentrically within second reservoir 35. Preferably, second reservoir 35 is positioned such that top end 36 is disposed below top end 31 of first reservoir 30 and alligned to receive a liquid cleaning fluid flowing from first reservoir 30 over weir 34. Second reservoir 35 can be a physically separate element from first reservoir 30 or be attached thereto or be an integral, e.g., molded, part thereof. Those skilled in the art will recognize that second reservoir 35 can be configured with first reservoir 30 in various ways in order to permit the flow of cleaning fluid from first reservoir 30 to second reservoir 35.

The materials of construction of first reservoir 30 and second reservoir 35 are not critical to the present invention. Typical materials of construction include, for example, metal, glass, ceramics, plastics and combinations thereof. Preferably, non-wetting materials, i.e., "phobic" to the cleaning fluid, are used at the inside upper portion of first reservoir 30 in order to create reverse or negative menisci of the fluid which extends above weir 34 when first reservoir 30 is filled with fluid.

The apparatus also comprises a transducer 39, which is a device capable of emitting megasonic vibrations as described above. The cross-sectional geometry of transducer 39 is not critical to the present invention, although, it is generally preferred that the transducer has the same cross-sectional geometry as first reservoir 30. The details concerning such megasonic transducers are known to those skilled in the art. Megasonic transducers suitable for use in the apparatus of the present invention are available, for example, from Branson Ultrasonics Corporation, Danbury, Conn. The transducer is disposed at the bottom end 32 of first reservoir 30 in order to generate megasonic vibrations in a generally perpendicular direction from bottom end 32 toward the top end 31. Transducer 39 may be mounted, for example, below bottom end 32 and bottom end 32 can be comprised of a material transparent to the megasonic vibrators, e.g., quartz.

Preferably, the apparatus further comprises a means for withdrawing the fluid from second reservoir 35 and recirculating the withdrawn fluid to first reservoir 30. It is also preferred the apparatus further comprises a means for filtering the withdrawn fluid to remove particular materials. A first conduit 40 is provided having a first end connected to bottom end 37 of second reservoir 35 and in communication with the interior of second reservoir 35 and a second end connected to an inlet of a pump 41. A second conduit 42 is provided having a first end connected to an outlet of pump 41 and a second end connected to an inlet of a filter 43. A third conduit 44 is provided having a first end connected to an outlet of filter 43 and a second end connected to an inlet of a heating and cooling element 45. A fourth conduit 46 having a first end connected to an outlet end of heating and cooling element 45 and a second end connected to the bottom end 32 of first reservoir 30 and in communication with the interior of first reservoir 30.

The details concerning the pumps, filters and heating and cooling elements suitable for use in the apparatus of the present invention are known to those skilled in the art and are commercially available. Preferred filters for use in accordance with the present invention are depth filters which have a particle size ranging from about 0.1 to 10 microns. Such depth filters are commercially available, for example, from Millipore Corp., Bedford, Mass. Another means for removing the particular materials is by membrane filtration, the details of which are known by those skilled in the art.

Preferably, a cover 47 is provided in order to minimize evaporation of the cleaning fluid when the apparatus is not in use.

The overall size of the apparatus is not critical to the present invention. Since the cleaning can occur by movement of the object relative to the cleaning fluid, the apparatus can be smaller than the object itself. A typical apparatus in accordance with the present invention will have a length of about 1 to 6 inches to accommodate the first and second reservoirs, i.e., point A to point B on FIG. 2. The width will typically be dependent upon the width of object being coated which often ranges, for example, from about 6 to 24 inches (not shown on FIG. 2).

Although, the present invention has been described with respect to specific aspects, those skilled in the art will recognize that many variations are possible within the scope of the claims that follow. For example, in addition to the specific cleaning methods described herein, those skilled in the art will recognize that the present invention may be applicable to other processes such as, for example, a cleaning step either prior to or after applying a metal coating to a substrate, e.g., metalizing.

I claim:

1. A method for cleaning an object, comprising:
   a) introducing megasonic vibrations into a volume of liquid cleaning fluid having an upper liquid level, said fluid being contained in a first reservoir having a weir, said vibrations being effective to cause the upper level of said fluid to rise above the weir at a distance of at least 0.5 millimeter and said fluid to flow over the weir into a second reservoir; and
   b) contacting the upper level of said fluid above the weir with a surface of the object sufficient to form a menisci of said fluid between said surface of the object and the weir, said surface being disposed above the weir such that at least a portion of said fluid contacts said surface prior to flowing over the weir into the second reservoir.

2. The method of claim 1 further comprising advancing said surface of the object relative to the weir in a generally horizontal direction.

3. The method of claim 2 wherein said surface of the object is advanced at a rate of about 10 to 1000 millimeters per minute.

4. The method of claim 1 further comprising circulating said fluid by withdrawing said fluid from the second reservoir and introducing the withdrawn fluid to the first reservoir.

5. The method of claim 4 wherein the circulation of said fluid is effective to cause said fluid to flow over the weir into the second reservoir.

6. The method of claim 4 further comprising filtering the withdrawn fluid to remove particulate materials prior to introducing the withdrawn fluid to the first reservoir.

7. The method of claim 6 wherein the filtration of the withdrawn fluid is effective to remove at least about 50 percent of the particulate materials in the withdrawn fluid having a particle size greater than about 1 micron.

8. The method of claim 1 wherein said vibrations are effective to cause the upper level of said fluid to rise above the weir at a distance of from about 1 to 10 microns.

9. The method of claim 1 wherein the megasonic vibrations are introduced at a frequency of from about 800 KHz to 1.8 MHz.

10. The method of claim 9 wherein the vibrations travel through said fluid in a generally upward direction through the first reservoir toward said surface of the object.

11. An apparatus for cleaning a surface of an object wherein said surface of the object is disposed above the apparatus in an inverted orientation, said apparatus comprising:
 a) a first reservoir having a top end which is at least partially open, a bottom end which is at least partially closed, at least one straight side wall and a weir disposed at the top end;
 b) a second reservoir having a top end which is at least partially open, a bottom end which is at least partially closed and at least one side wall, said second reservoir being positioned such that the top end of the second reservoir is below the top end of the first reservoir and aligned to receive a liquid cleaning fluid flowing from the first reservoir over the weir; and
 c) a transducer disposed at the bottom end of the first reservoir, said transducer being capable of generating megasonic vibrations in a generally perpendicular direction from the bottom end toward the top end of the first reservoir effective to cause an upper level of said fluid to rise above the weir at a distance of at least 0.5 millimeter, contact said surface and flow over the weir into the second reservoir.

12. The apparatus of claim 11 further comprising a means for withdrawing said fluid from the second reservoir and introducing the withdrawn fluid to the first reservoir.

13. The apparatus of claim 12 further comprising a means for filtering the withdrawn fluid to remove particles.

14. The apparatus of claim 13 wherein the means for withdrawing said fluid comprises a first conduit having a first end in communication with said fluid in the second reservoir and a second end connected to an inlet of a pump, a second conduit having a first end connected to an outlet of the pump and a second end connected to an inlet of a filter, and a third conduit having a first end connected to an outlet of the filter and a second end in communication with said fluid in the first reservoir.

15. The apparatus of claim 14 wherein the first end of the first conduit is connected to the bottom end of the second reservoir, the second end of the third conduit is connected to an inlet of a heating and cooling element and a fourth conduit is provided having a first end connected to an outlet of the heating and cooling element and a second end connected to the bottom end of the first reservoir.

16. The apparatus of claim 11 wherein said at least one side wall has a upper end which comprises the weir.

17. The apparatus of claim 16 wherein the first reservoir has four side walls and the upper end of each side wall forms the weir.

18. The apparatus of claim 16 wherein the first reservoir has one continuous side wall forming a circular cross-section wherein the upper end of the side wall forms the weir.

19. The apparatus of claim 11 wherein the transducer is capable of generating megasonic vibrations effective to cause the level of said fluid to rise above the weir at a distance of from about 1 to 10 millimeters.

20. In an apparatus for cleaning a surface of an object, comprising:
 a) a first reservoir having a top end which is at least partially open, a bottom end which is at least partially closed, at least one side wall and a weir disposed at the top end; and
 b) a second reservoir having a top end which is at least partially open, a bottom end which is at least partially closed and at least one side wall, said second reservoir being aligned to receive a liquid cleaning fluid flowing from the first reservoir over the weir;
 the improvement wherein;
 (i) the first reservoir is positionable beneath said surface of the object when said surface is an inverted orientation;
 (ii) the second reservoir is positioned such that the top end of the second reservoir is below the top end of the first reservoir;
 (iii) a transducer is disposed at the bottom end of the first reservoir, said transducer being capable of generating megasonic vibrations in a generally perpendicular direction from the bottom end toward the top end of the first reservoir effective to cause an upper level of said fluid to rise above the weir at a distance of at least 0.5 millimeter, contact said surface and flow over the weir into the second reservoir;
 (iv) the apparatus is smaller than the object and
 (v) said at least one side wall in the first reservoir is straight.

* * * * *

UNITED STATES PATENT AND TRADEMARK OFFICE
CERTIFICATE OF CORRECTION

PATENT NO. : 5,339,842
DATED : August 23, 1994
INVENTOR(S) : Hendrik F. Bok

It is certified that error appears in the above-indentified patent and that said Letters Patent is hereby corrected as shown below:

Claim 8, lines 3-4, delete the word "microns" and substitute therefor --millimeters--

Signed and Sealed this

Fifth Day of August, 1997

Attest:

Attesting Officer

BRUCE LEHMAN

Commissioner of Patents and Trademarks